United States Patent [19]
Weintraub et al.

[11] 4,221,006
[45] Sep. 2, 1980

[54] BALANCED REMOTE CONTROL

[76] Inventors: Morton Weintraub, 1542 47th St.;
Elliot Waxman, 1825 50th St.;
Bernard Gendelman, 1340 52nd St.,
all of Brooklyn, N.Y. 11219

[21] Appl. No.: 21,553

[22] Filed: Mar. 19, 1979

Related U.S. Application Data

[63] Continuation-in-part of Ser. No. 911,162, May 30, 1978, Pat. No. 4,145,720.

[51] Int. Cl.² ............................................. H04B 1/16
[52] U.S. Cl. .................................. 455/355; 179/1 VL
[58] Field of Search .................... 325/37, 64, 389–395, 325/51, 53, 397, 406; 179/1 VL

[56] References Cited
U.S. PATENT DOCUMENTS 3,497,622  2/1970  Markin et al. ................ 179/1 VL

*Primary Examiner*—Robert L. Richardson

[57] ABSTRACT

This invention relates to a stereo system that maintains an equal listening level, automatically increasing or decreasing in relationship to interfering noises or the absence thereof while maintaining a balanced audio level from the speakers in relationship to the listener's position, automatically adjusting to his movements.

Switching means for switching speakers from one source to another and/or the means for inducing thereon an auxiliary audio intelligence signal from a remote location. All the above functions being achieved remotely, wirelessly, from a plurality of locations.

10 Claims, 12 Drawing Figures

BALANCED REMOTE CONTROL

This is a continuation in part of the copending application of Morton Weintrabu et al Ser. No. 911,162, name of application "Remote Control" filed May 30, 1978 and now U.S. Pat. No. 4,145,720.

BACKGROUND OF THE INVENTION

This invention relates to the wireless remote control of the speakers of a stereo system from remote locations and the automatic maintenance of a preset desired lestening level, wirelessly, automatically balanced, irregardless of the listeners position in the room.

DESCRIPTION OF PRIOR ART

Stero systems found in prior art present the following shortcomings:

(1) To achieve a desired balance control at a given point, a listener would adjust his balance control for a desired balance at that point. However, should the listener move away from that point, it would be necessary to readjust the stereo system again as to his new position. Also, at times good balancing would require at least two people - one for controlling at the controls, while the other is directing him as to the desired level from his position.

(2) A lone listener would therefore be forced to leave his listening position in order to readjust the controls over and above any disturbing noise levels in order to override that noise level.

(3) Moreover, a lone listener would be forced to leave his listening position in order to readjust the controls lower in order that he may clearly hear what someone speaking to him has to say. When the voice saying has ended, a readjustment of the controls would be necessary. Again requiring movement from the listeners position.

(4) Manual switching is required at an operative tuner for sound to enter the speaker.

(5) A wired connection to the amplifier or speaker is required in order to receive an auxiliary intelligence signal.

SUMMARY OF THE INVENTION

An object of this invention is to maintain a perfect balance of the speakers of a stero system irregardless of the listeners movement towards or away from the speakers and/or to automatically reduce the sound to desired level at certain locations.

A further object of this invention is to provide the means for automatic override of any undesired disturbing noise by the automatic adjustment of sound levels of the speakers in proportion to a desired relationship to the undersired interfering noise levels.

A further object of this invention is provide the means for automatic reduction of the sound level of the speakers when the user is talking to someone.

A further object of this invention is to provide the means whereby a signal from among a plurality of signals can be selected to drive the output of a speaker and/or to increase the level of the speaker or speakers and/or to provide the means for mixing sounds wirelessly from a plurality of sound sources.

A further object of this invention is to provide the means whereby an auxiliary intelligence signal may be inserted into the stereo system remotely, wirelessly, from a plurality of locations.

Still a further object of this invention is to provide the means whereby a listener may select to increase or decrease the sound of the speakers output to react to a single frequency range so as to increase or decrease that frequency range alone, but not others; such as to automatically increase or decrease the level of bass or treble instruments alone.

Other objectives will become apparent during the course of the disclosure.

Closely associated with and functioning in accordance with the principles underlying the Guided Electronic Remote Control of Audio and Video System, via wireless transmission, is the Guided Audio System. The Guided Audio System, which henceforth shall be abbreviated and known as the G.A.S., provides for the automatic remote control of a balanced audio volume of sound emanating from each individual speaker regardless of the movement listener employing G.A.S. in the vicinity of the plurality of speakers and regardless of increase or decrease of speaker volume.

The G.A.S. includes the following components:
1. Master control unit (see FIG. 2: 219,220,272,367–374)
2. Sub master control unit (see FIG. 2: 221–240)
3. Sub sub master control unit (see FIG. 2 : 275–284)
4. Sub sub driver unit (see FIG. 3: 285–304, 306)
5. Automatic overriding balance control unit (see FIG. 5, see also FIG. 2: 313–317 and FIG. 6)
6. Slave drive unit (see FIG. 4: 362–366)
7. Sub slave drive unit (see FIG. 4; 241–256, 260–263, 265–269)

FIG. 1 is a block schematic drawing depicting the G.A.S. system in its entirety, tracing the signal from its inception and through the various components of the system. Whereever appropriate, we shall indicate where the various components are found in detailed drawings in this patent application.

Figure 1:
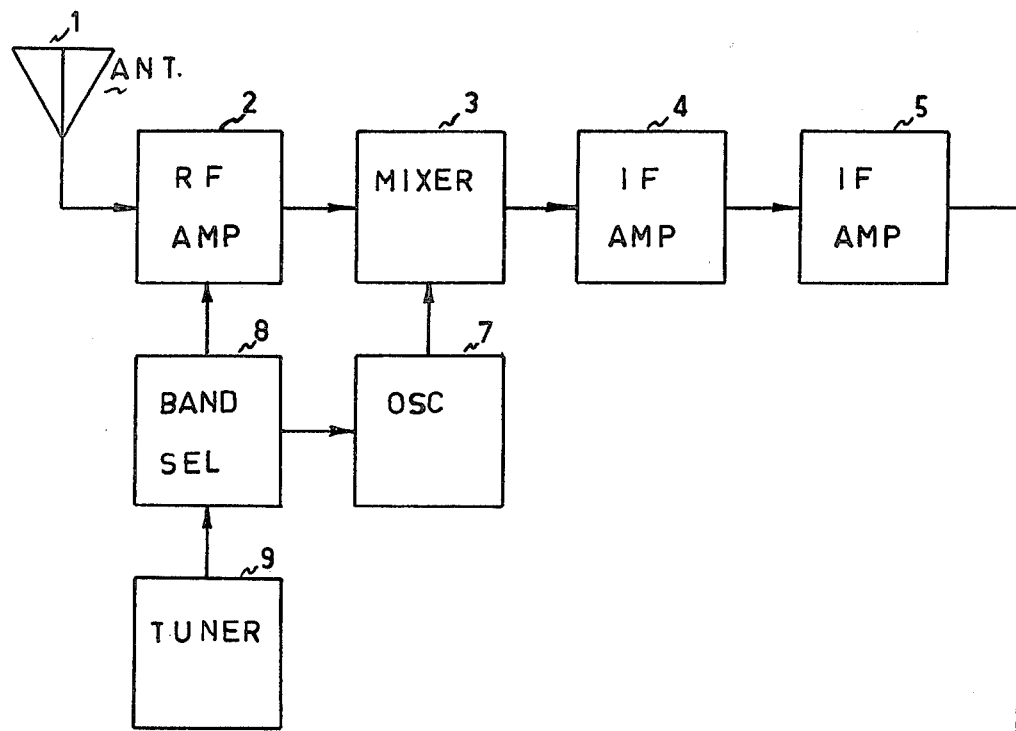
FIG. 1 is a block diagram drawing depicting the relationship of the seven components and signal travel through the seven components of the G.A.S.
Figure 1:
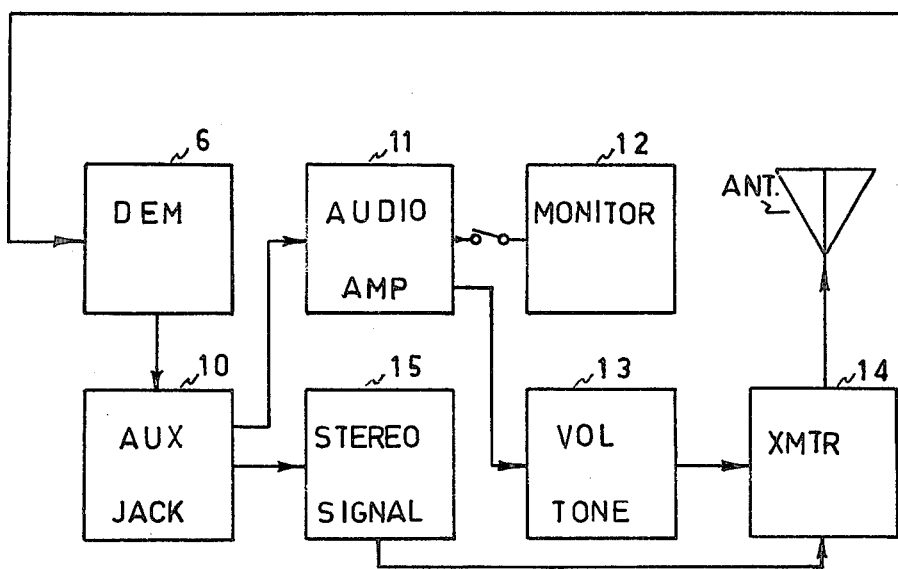

When a radio wave is received at receive antenna 212 it is passed to the main control unit 201. (see FIG. 1). The signal is retransmitted over to antenna 217 and is received by slave drive component 205, (see FIG. 4), via receive antenna 213. Send antenna 214 retransmits a signal and the signal is received by receiver 208.

When sub master control unit 202 (see FIG. 2) is adapted to master control 201 and sub slave unit 206 (see FIG. 4) is adapted to slave component 205 and receiver 208, secondary controls or sub controls are enabled. The signal of sub master control 202 may operate either through master control unit 201 as a single composite unit, or it may operate at a remote location. In either situation, sub master control unit 202 controls the speaker(s) of receiver 208 through sub slave control unit 206. Note that sub slave control unit 206 may also operate through remotely located slave drive control unit 205 or it may operate in conjunction with it as a single unit. Likewise, sub sub master control unit 203 (see FIG. 2) may be adapted so that when it is connected to sub master control unit 202 controls same through sub sub driver 204 (see FIG. 3). A number of sub sub drivers 204 may be placed at various remote locations hence permitting the control of some or all of the functions of sub master control unit 202 from an equal number of remote locations, when sub master control unit 202 is connected to sub sub master control unit 203, with sub sub drive unit 204 and sub sub master unit 203 acting as transmitter-receiver forming the connecting link between sub master control unit 202 and sub sub drive unit 204. By adding balance component 207 (see FIG. 7) this would enable the automatic balanced control of speakers 209, 210, 211, via a signal transmitted from balance control unit 207 to sub sub drive unit 204 and a signal from sub sub drive unit 204 transmitting to sub sub master control unit 203 via antenna 215 to antenna 216 through to sub slave control unit 206.

Hence, we may summarize the signal route as follows: A signal from base station is received at antenna 212. An exchange signal is transmitted to the air via send antenna 217. The signal is received at receive antenna 213. An exchange signal is transmitted via antenna 214 which is received by receiver 208. Special signals are transmitted via antenna 217 via sub control unit 202 or special signals may be transmitted directly via its own antenna 233 (see FIG. 2). Special signals are received by antenna 213 and may be transmitted to sub slave control unit 206 via its own antenna (see FIG. 4) or may be received directly by control unit 207 for interpretation via its own antenna 241 (see FIG. 4) thereby the output signal to speakers 209, 210, and 211.

Note that sub sub control unit 203 in conjunction with sub sub drive unit 204 202, acts as a transmitter receiver with a special signal for controlling sub master control unit 202 via sub sub control unit 20.

Balance component 207 contains an oscillator generating a transmitted signal via its antenna 218. Its signal is received by sub sub drive unit 204. Balance component 207 in conjunction with sub sub drive unit 204 serves to balance the output of the speaker system by effecting the addition or subtraction of volume to each speaker individually to the desired level (regardless of the position of the person in the room holding balance component 207) with respect to two or more speakers. The provided balanced output is continuous regardless of the movement of the listener holding balance component 207, moving toward or away from the speakers. A listener obtains a balanced output from the center of the room by setting sub sub drive unit 204 to balance position (see FIG. 3). Following this, a balanced output is maintained regardless of movement by the listener.

Figure 5:
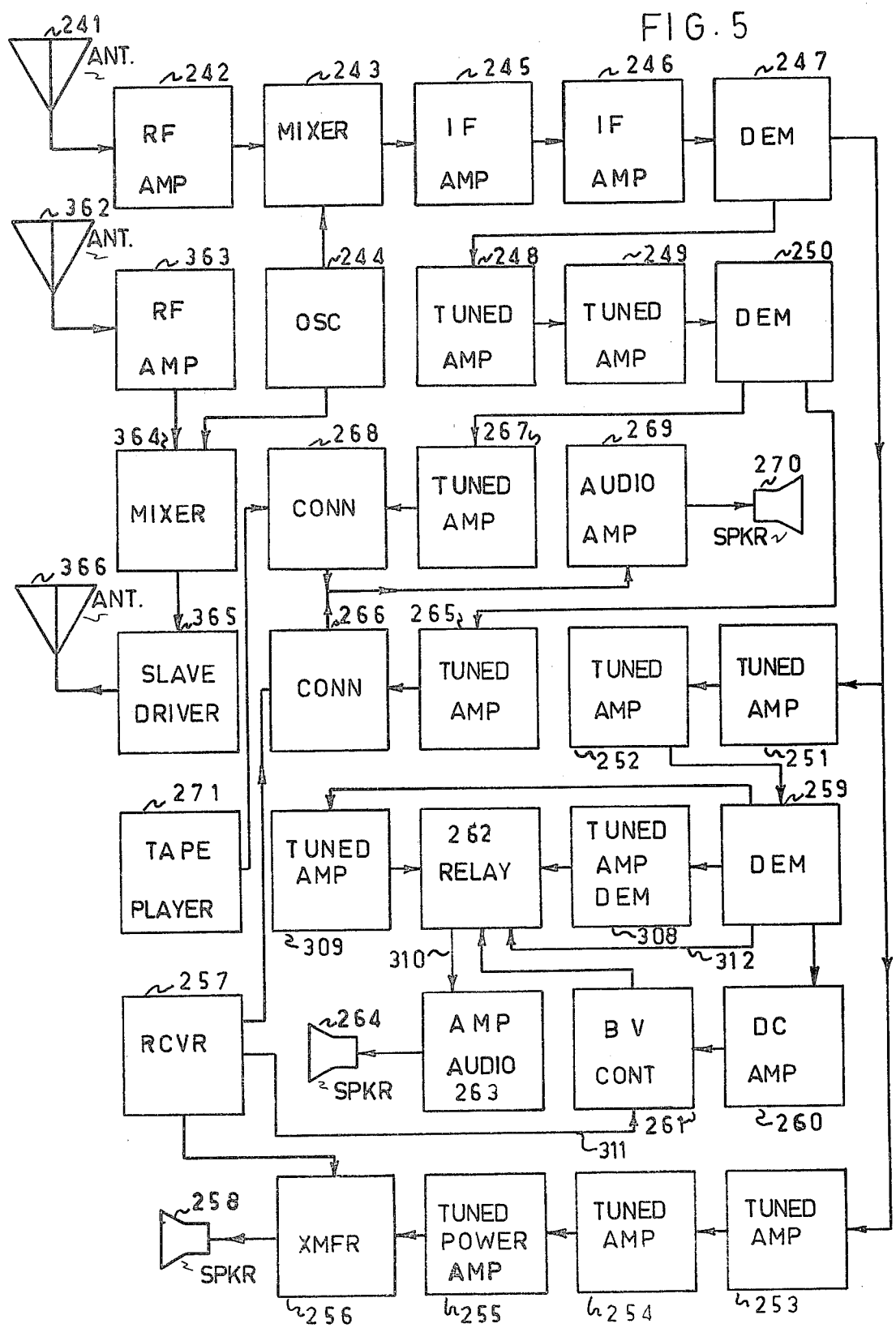
FIG. 5 is a block diagram drawing of the circuitry of the automatic overriding balance control.

Instead of manual volume control described herein, the automatic over-riding volume-balance control 345 may be substituted (see FIG. 5 via switch 346 switched to stage 347).

Hence, we may described the signal route in this case as proceeding from balance component 207 to components 204, 203, 202, 201, 205 and 206, in sequential order, and balancing speakers 209, 210 and 211.

Figure 7:
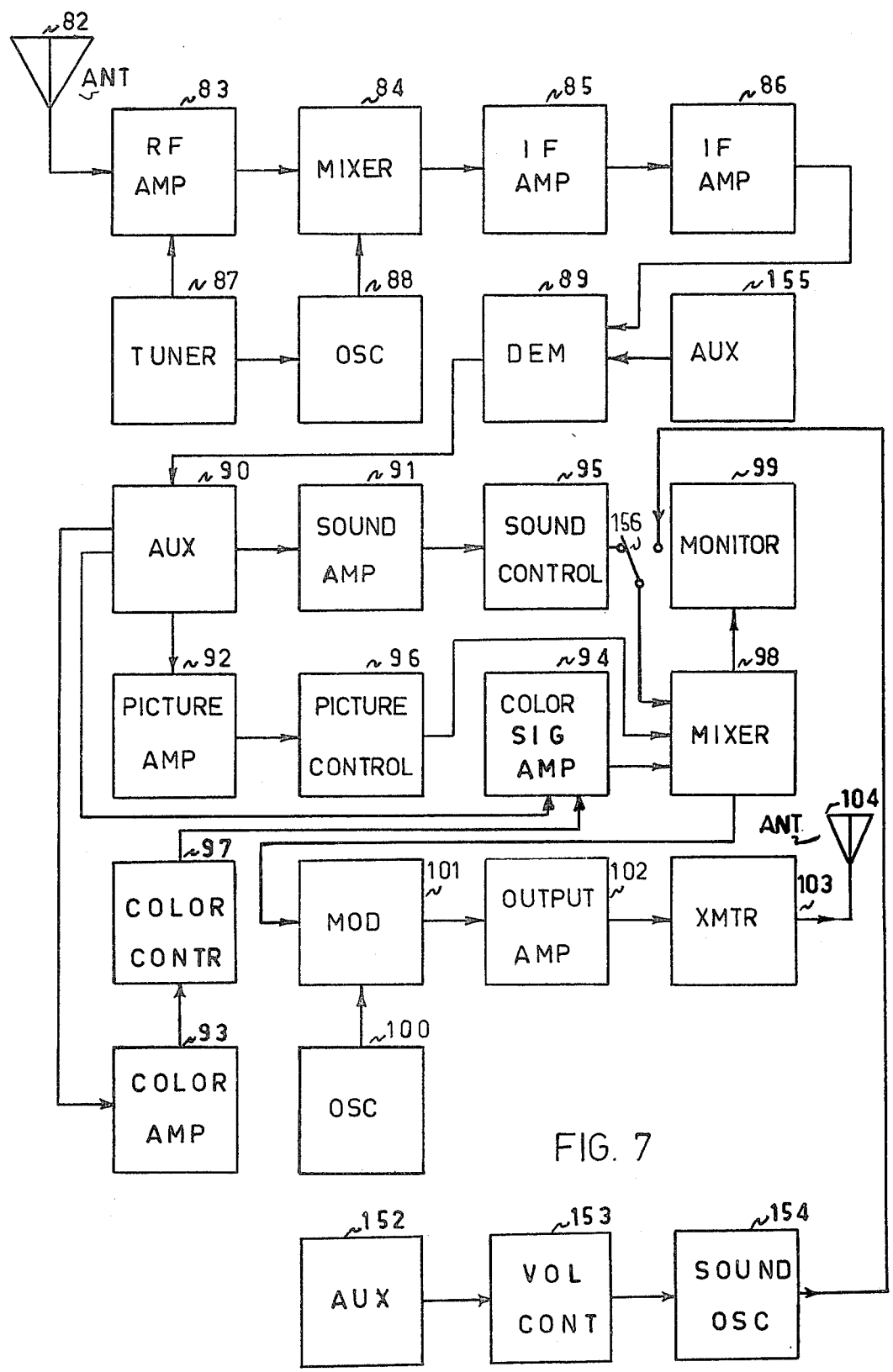
FIG. 7 is a block diagram drawing of the overview of overriding balance control.

Note that balance component in FIG. 7 is the same componant for a balanced control and also for automatic over-riding volume balance control. When used for balance alone switch 346 is switched to volume control 350, while when used for automatic over-riding volume-balance control, switch 346 is switched to volume control 345.

Figure 2:
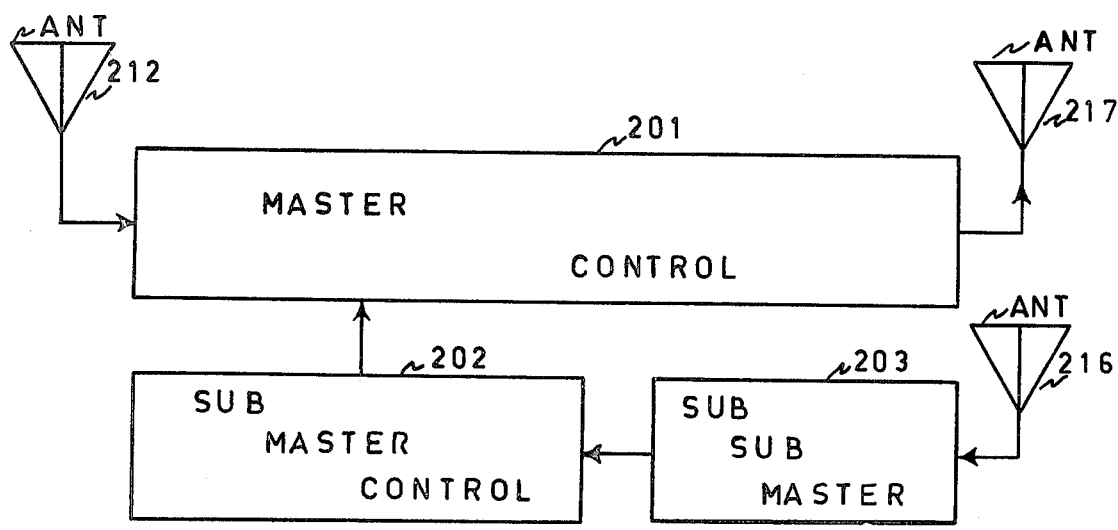
FIG. 2 is a block diagram drawing of the circuitry of the master sub master unit and sub, sub, master unit
Figure 2:
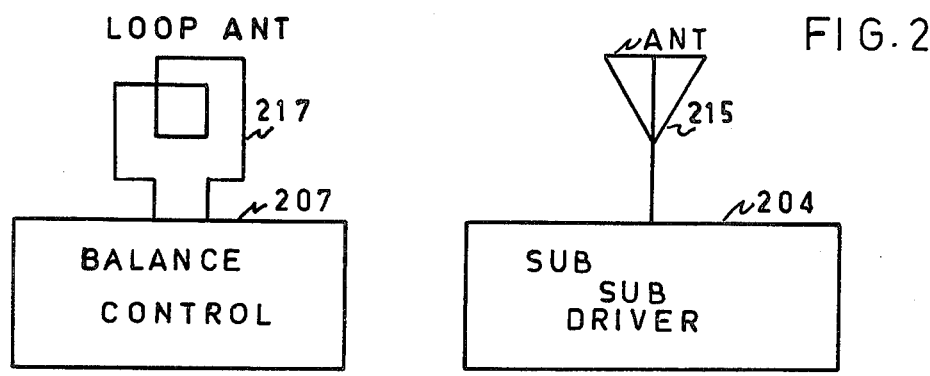
Figure 2:
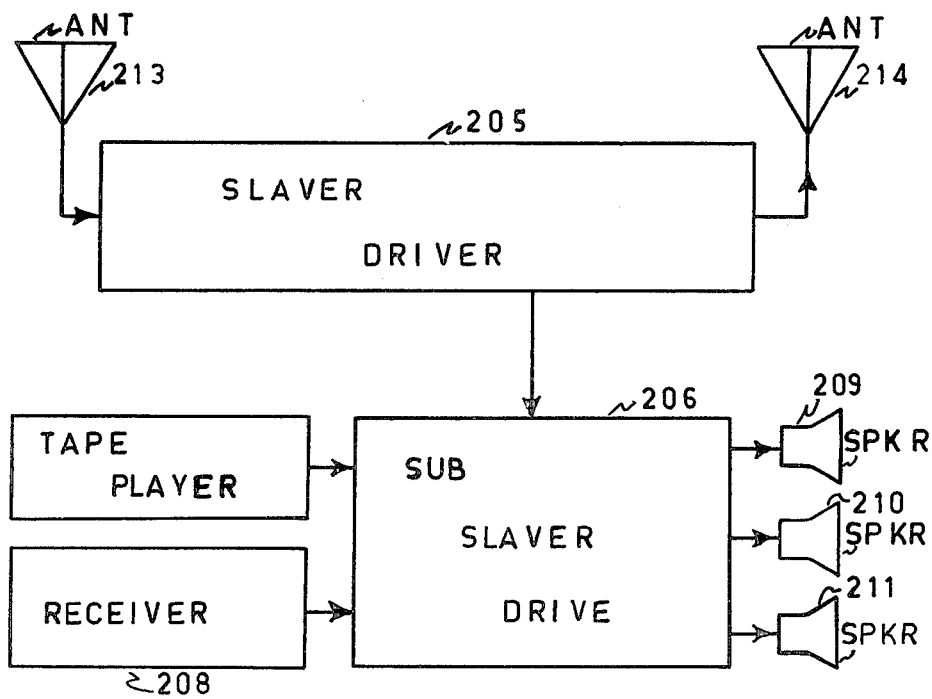

Describing now the master control unit of the G.A.S. system, (see FIG. 2).

Figure 10:
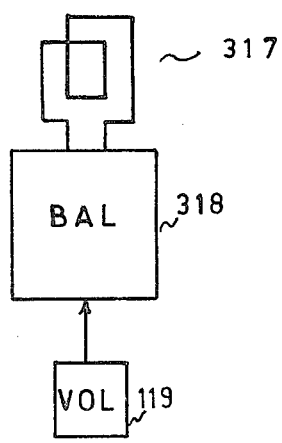
FIG. 10 is a block diagram drawing of the internal circuitry of an synchronizing oscillator.

Radio frequency signals are received at receive antenna 272 and are amplified and tuned by tuner 219. Signals are further amplified as an IF signal by IF amplifier 220 (after passing stages 369, 371, 372, 373) and fed to limiter 221 (optional) limiting the amplitude of the signals, hence keeping out interference and noise by removing amplitude variations from the signals. Synchronizing amplifier 222 is tuned to the center, or so called "resting frequency" of the IF signal. The provided synchronous signal is employed to phase oscillator 223 to oscillate in phase with the original IF signal (see FIG. 10 a diagram of the sychronizing oscillator). Automatic gain control stage 223, 224 serves to amplify, even out, and control the output of oscillator 223 which may achieve somewhat an increase or decrease in its power resulting in a change of the "resting frequency" during modulation as a result of the action of synchronizing signal. Amplifier 225 serves to amplify the automatic gain control stage 224 signal strong enough to drive a variety of frequency doublers.

Note that the aforementioned stages 221-225 are employed primarily to remove the amplitude or frequency modulation which may interfere with the frequency doubler's output and are employed as aids in phasing all frequency doublers.

Describing now the internal operations of the sub master control unit (see FIG. 2). The phased output signals from doubler 226 is passed to modulators 227, 228, and 229 and this output is passed to output amplifiers 230, 231, 232 and is transmitted via antenna 233. Although a single antenna 233 is used herein, three individual antennas may be employed. Modulators 227, 228, 229 are fed by tuned oscillators 234, 235, 236, of which the output of 235 and 234 may be increased or decreased by volume controls 237 and 238. The signal of oscillator 236 is modulated by the signal of two additional tuned circuits oscillator 239 and 240. Note, all signals of all oscillators act as keys to control remotely all sub controls.

Figure 3:
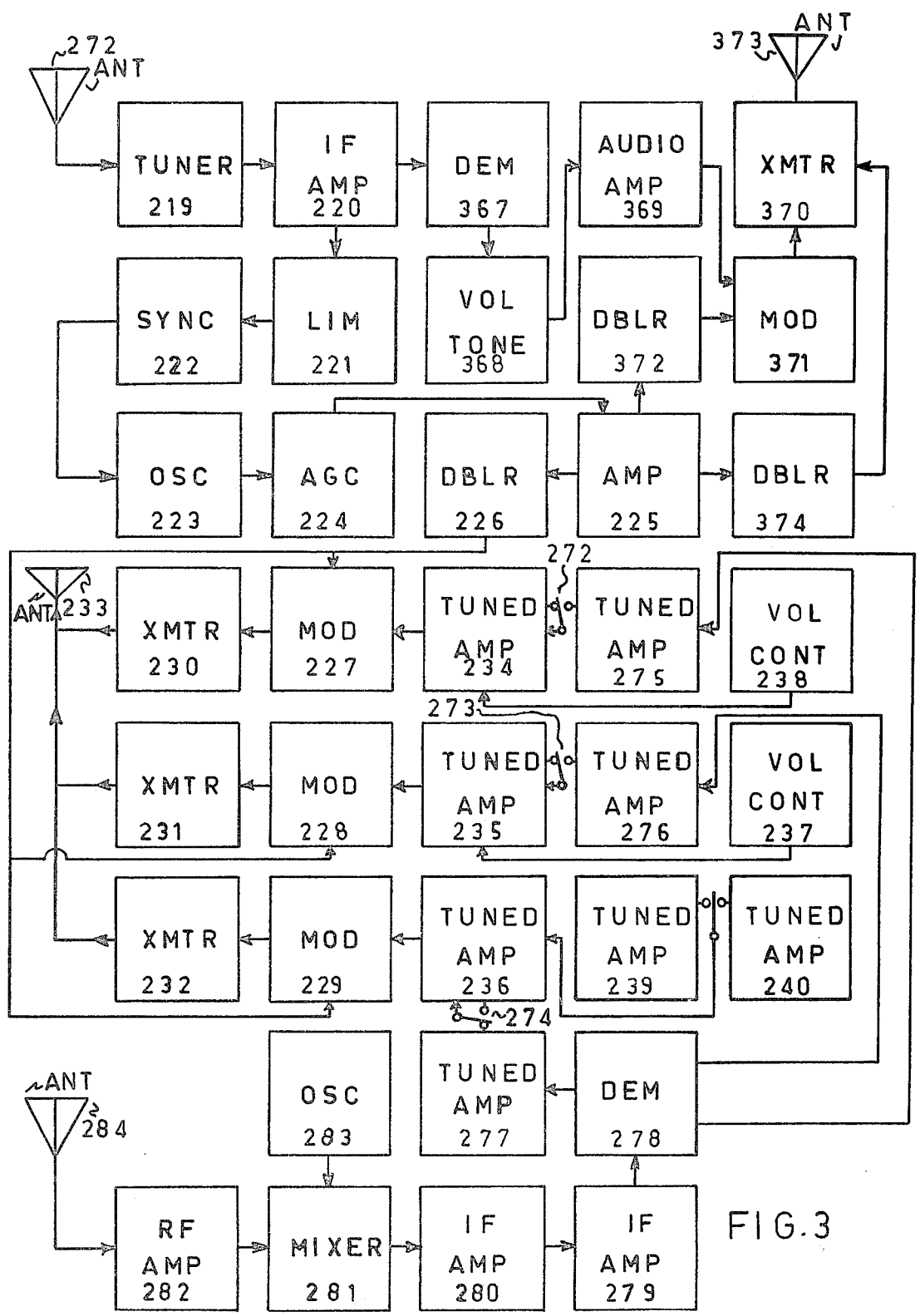
FIG. 3 is a block diagram drawing of the circuitry of the sub sub drive.
Figure 4:
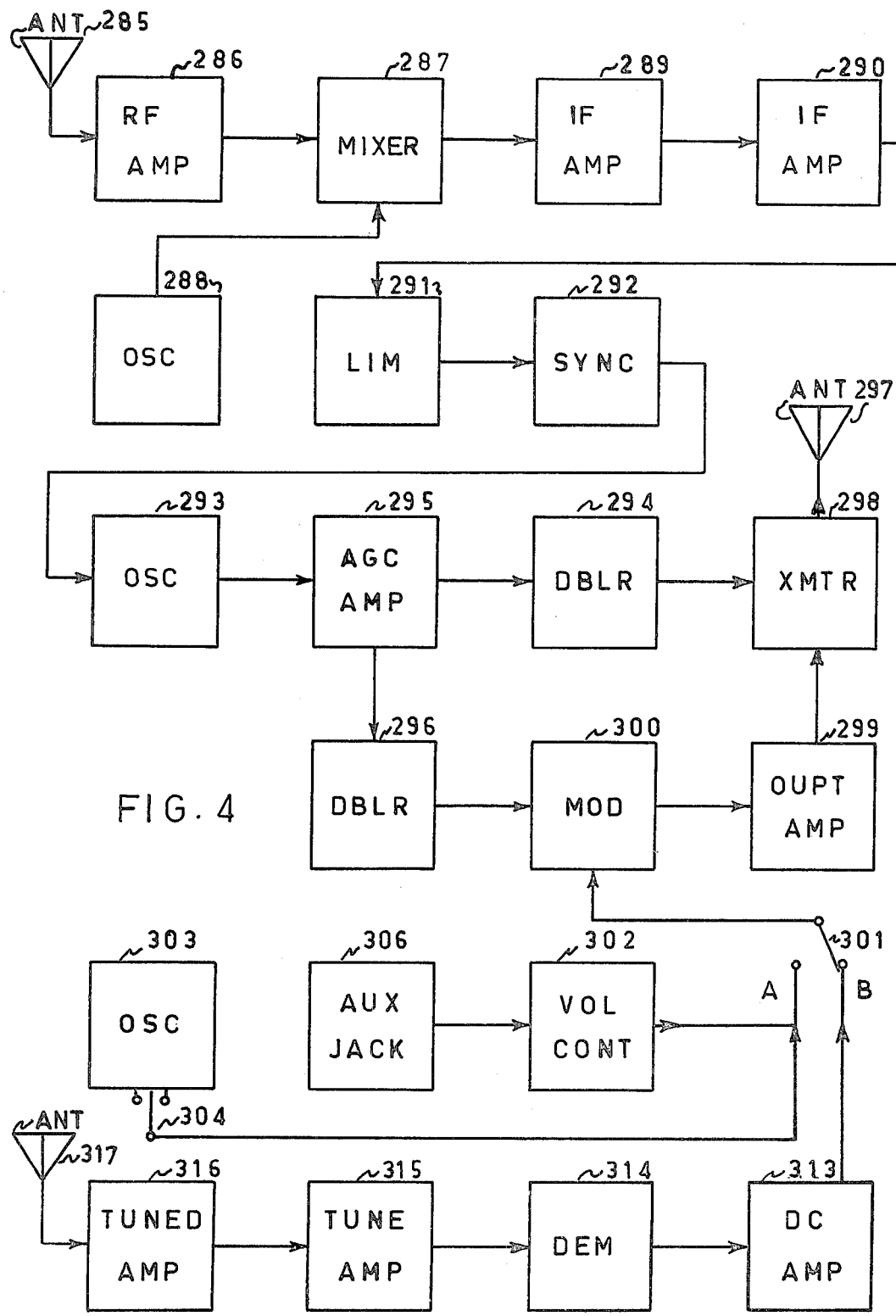
FIG. 4 is a block diagram drawing of the circuitry of the sub slaverdrive, and slave drive (optional) #365 is FIG. 5 in our copending application "Remote Control".

The transmitted signal of the sub master control via antenna 233 is received by sub slave control unit via its receive antenna 241 (see FIG. 4). The signal is then amplified by radio frequency amplifier 242, mixed by mixer 243 in conjunction with oscillator 244, amplified by amplifiers 245 and 246, and demodulated by demodulator 247. This output signal is branched to three sets of tuned circuits: 248, 249, 251, 252, 253, 254, a tuned circuit amplifier is an amplifier tuned to amplify a single frequency while rejecting other frequencies. The output of tuned circuit amplfier 254 is fed to tuned circuit power amplifier 255 and to speaker 258 via its transformer 256. Note that transformer 256 is tapped to receiver 257 so that it will receive its signal simultaneously with the output signals of the power amplifier 255, so that when the latter's signal is strong its ultrasonic signal will override the output signal of receiver 257. This will result in a lowering of the sound output of speaker 258. A weaker signal from the power amplifier 255 will permit audibility; the level of audibility is selected by the user via volume control 238 (see FIG. 3) serving to increase or decrease the signal of tuned oscillator 234 with such increase or decrease reflected in the signal to transformer 256. To provide such special functioning at optimum levels, transformer 256 may be shunted by a tuning capacitor at the center tap to ground, tuning the transformer to the resonance of the ultrasonic frequency signal. In such a case a ferrite core may also be used.

Figure 8:
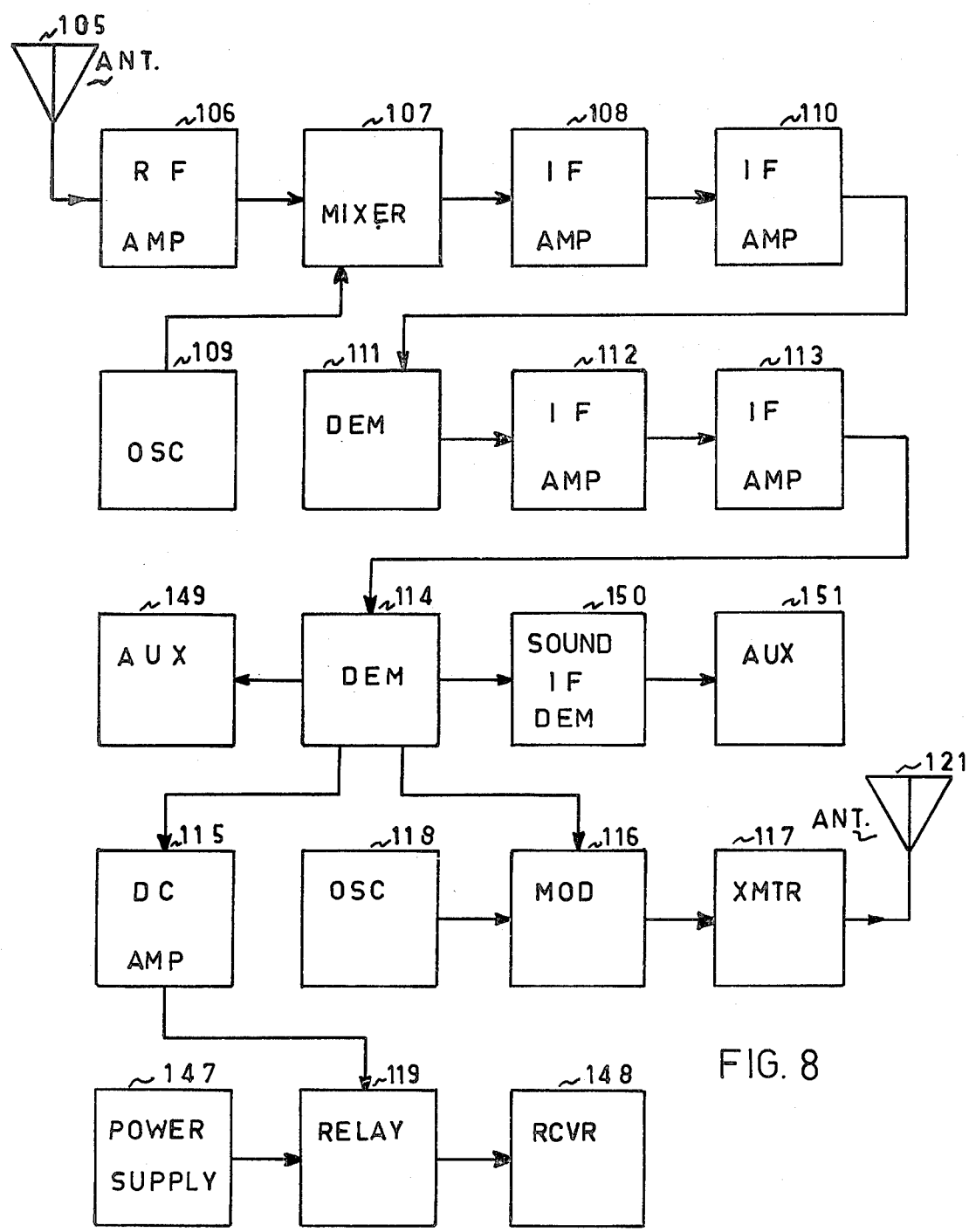
FIG. 8 is a block diagram drawing of internal circuitry of balanced voltage control.

The signal to a second branch controlling speaker 264 is provided by tuned oscillator 235, wherein its signal is passed to tuned circuit, amplifiers 251 and 252, then to demodulator 259, after being received by antenna 241 and passing through stages 242-247. Demodulator 259 changes the signal to a DC level signal which is then amplified by DC amplifier 260 and fed to balanced voltage control 261 (see FIG. 8) which causes an increase or decrease to the signal fed to amplify 263 through relay 262 and stage 261. The level of audibility of speaker 264 from receiver 257 is determined by the signal level of DC amplifier 260 as its output is passed to balanced voltage control 261 which will, when in balance, produce a maximum signal over speaker 264 of receiver 257. On the other hand a minimum balanced signal will produce no audible sound to speaker 264, via amplifier 263. The increase or decrease of this volume is determined by the user when he increases or decreases volume control control 237 (see FIG. 2), thereby setting the level of the tuned oscillator signal 235 to be modulated. Modulator 228 hence determined the level of the output signal of demodulator 259 (FIG. 4).

The signal to a third branch controlling speaker 270 is provided by tuned oscillator circuitry 236 (see FIG. 2). Note that speaker 270 can be controlled to have the output of a radio or a phonograph or a tape recorder. After the signal of tuned circuit amplifier 249 is demodulated by demodulator 250, thereby separating the main oscillator signal 236 (see FIG. 2) from the oscillator signals, the signal of 239, when modulating oscillator 236, will cause channeler 266 (see FIG. 4) to operate. (A diagram of channelers 266 and 268 is provided in FIG. 12). Note that tuned circuit amplifier 265 (FIG. 4) is tuned to channeler 266 to receive only the signal of oscillator 239 (FIG. 2) and to feed same, whereas tuned circuit amplifier 267 (FIG. 4) is tuned to receive the signal coming from oscillator 240 (FIG. 2) and to feed it to channeler 268 for activation. The signals fed to channelers 266 and 268 will cause either the signal of a tape recorder 271 or a radio receiver 257 or both to passed on to 269 through channelers 266 and 268. Note that by having a sequence of channelers with a variety of signals passing into a channeler, these different signals can be selected wirelessly by a single oscillator with a tuning capacitor (or other tuning means) changing the oscillator signal, we would automatically channel one sound and reject others. Also, by having a volume control to increase or decrease the oscillator's signal of 239 or 240 (FIG. 2), this would result in an increase or decrease in sound level and/or tone by using one channeler for controlling volume and one for controlling tone or any other signal. Note, the same holds true for the BVC 261 (FIG. 4). Each BVC would control a different signal to increase or decrease the level of a signal to a desired level, by the increase or decrease of a DC signal; also by the use of a transformer were one coil is set to cancel the signal of another coil so that a total cancellation can be achieved. The BVC would create an opposite effect. Meaning, that when the voltage is at minimum balance at the BVC then there is minimum output from the transformer, since the cancellation signal would totally cancel the output. While with a totally unbalanced BVC the cancellation signal of the transformer's coil will be at minimum thereby resulting in a high output of the transformer or similar type of cancellation circuits. Also, stages 254-256 can be used to control levels of signals by overriding them to increase or decrease signals by increasing or decreasing oscillating signal fed to said stage.

When double pole switches 272, 273, 274 (FIG. 2) are set manually to left position, the signal from stages 234-236 are fed back to said stages, thus serving as oscillators. However, when said switches are moved to right position, stages 234-236 serve only as amplifiers and the feedback for oscillation is cut off. Hence, signals are passed and amplified from tuned circuit amplifier 275-277, which are each respectively tuned to the frequencies of tuned circuit amplifiers 234-236. The signals of tuned circuit amplifiers 275-277 stem from demodulator 278.

The received signal via antenna 284 passes through radio frequency amplifier 282 wherein it is amplified and thereafter mixed by mixer 281 in conjunction with oscillator 283. The signal is then amplified by IF amplifiers 280 and 279 and demodulated by demodulator 278 forming at its output, from one to three control signals—depending on how many are desired—all signals picked up by tuned circuits amplifiers 275-277, each of which is tuned to the frequency of one of its control signals. These signals are then passed on to tuned circuit amplifiers 234-236 and to modulators 227-229 and to output amplifiers 231-232 and to antenna 233 to the air.

Describing now the internal operations of the sub, sub drive component. See FIG. 4.

After signal is received over antenna 285 it is amplified by RF amplifier 286, mixed by mixer 287 in conjunction with oscillator 288, amplified by IF amplifiers 289, 290 and passed to limiter stage 291 which serves to limit the IF signal of IF amplifier 290. Synchronizer 292 synchronizes the limited signal to oscillator 293. Automatic gain control 295 is the AGC for the oscillator signal 293 which signal 295 is fed to frequency doublers 294 and 296.

Note that stages 291, 292, 293, 295 operate in the same manner as stages 221-224 previously described (see FIG. 2) both serving to provide a phased signal with the main transmitting antenna in FIG. 2). Synchronizer 292 synchronizes frequency doublers 294 & 296 to produce signals for transmitter 298 and modulator 300. Note that stages 285 to 295 are optional and may be omitted in an area where signal phasing is unimportant. Of course if such stages were omitted stage 296 would be an oscillator and transmitter 298 would also provide an oscillated signal. Hence signals from modulator 300 would be transmitted over antenna 297. Similarly, the phasing stages can be omitted in FIG. 2 where phasing is unimportant.

A modulated signal is received at output amplifier 299 and is transmitted via transmitter 298 and in turn via antenna 297. It is the frequency doubler 294 that creates the frequency of transmitter 298 when doubler is used. The signal from antenna 297 passes to receive antenna 284 hence connecting FIG. 3 to FIG. 2. It should be noted that since we have previously stated that tuned circuit amplifiers 275, 276, 277 are each tuned to individual frequencies, we should really explain that three components described in FIG. 3 are necessary to provide the signals for amplifiers 275-277, since the components described in FIG. 3 transmit a single control frequency. Three (or more) of said components are used in cases where there are many users at different locations desiring to control remotely the output of their speakers in their own rooms for example. However, all three components would be identical to that which is described in FIG. 3 save only that each control signal operates with a different frequency we have shown only one such figure. Note that transmitter 298 of all units would have the same frequency. Also, all signals from tuned amplifiers 275-277 (FIG. 2) have the same operation as described previously with regard to the operations of turned amplifier oscillator 234-236.

An additional feature is the auxiliary jack 306 which transmits an actual audio signal or a control signal. Switch 301 may by manually switched to position A being controlled by volume control 302, or it may be switched to position B to achieve a balanced signal via DC amplifier 313.

As the audio signal from auxiliary 306 is fed to volume control 302 and passed to stages 300-297 via switch 301, received at antenna 284, (FIG. 2) the signal passes through stages 282-278. From stage 278 the signal passes to tuned amplifier 276 and 235 and modulated doubler signal 226 through modulator 228 which modulated signal is transmitted by transmitter 231 and antenna 233.

The signal is received by antenna 241 (FIG. 4) from air passing to speaker 264 via branch beginning with tuned circuit amplifier 251. The signal strength of stages 251 is dependent on the signal strength of stages 276 and 235 which as of now switch 274 is in right position— which is dependent upon the transmitted signal of transmitter 298 (FIG. 3) which in turn is dependent upon volume control 302 controlling modulator 300. Volume control 302 sets the amplitude of the signal through modulator 300. Note volume control 302 has two functions: (1) when it is used as a control for an audio sound stemming from auxiliar 306 which would then act as a volume control for the audio signal (2) volume control 302 can also be used as to increase or decrease a subcarrier at constant level to control the Balanced Voltage control (BVC). When used as a control or a signal of a constant level, volume control 302 is increased. This will result in a decrease in the negative signal from ground to switch 301 thereby increasing the amplitude of the signal through modulator 300. Stated simply, as the volume is increased, this causes a negative voltage drop from volume control 302 to modulator 300 resulting in a higher amplitude signal from frequency doubler 296 to output amplifier 299.

In reference to FIG. 2, demodulator 367 demodulates IF output amplifier 220. Volume control 368 controls the demodulator. Output amplifier 369 amplifier the actual sound while modulator 371 modulates doubler 372 and feeds the output of the modulator's signal to transmitter 370 and to antenna 373. Note that double 374 phases transmitter 370 while doubler 372 phases its oscillating signal to that of the IF signal.

When transmitter 370 is used for FM transmission in conjunction with frequency doubler 374 the input signal from modulator 371 causes a change to the resonance of transmitter 370. This results in a change of frequency to transmitter 370 although doubler's 374 frequency remains the same.

In reference to FIG. 5 antenna 362 is the slave receiving antenna (see 205 in FIG. 1) RF amplifier 363 amplifies the received signal while mixer 364 mixes the RF signal in conjunction with oscillator 244 to produce an IF signal.

Figure 9:
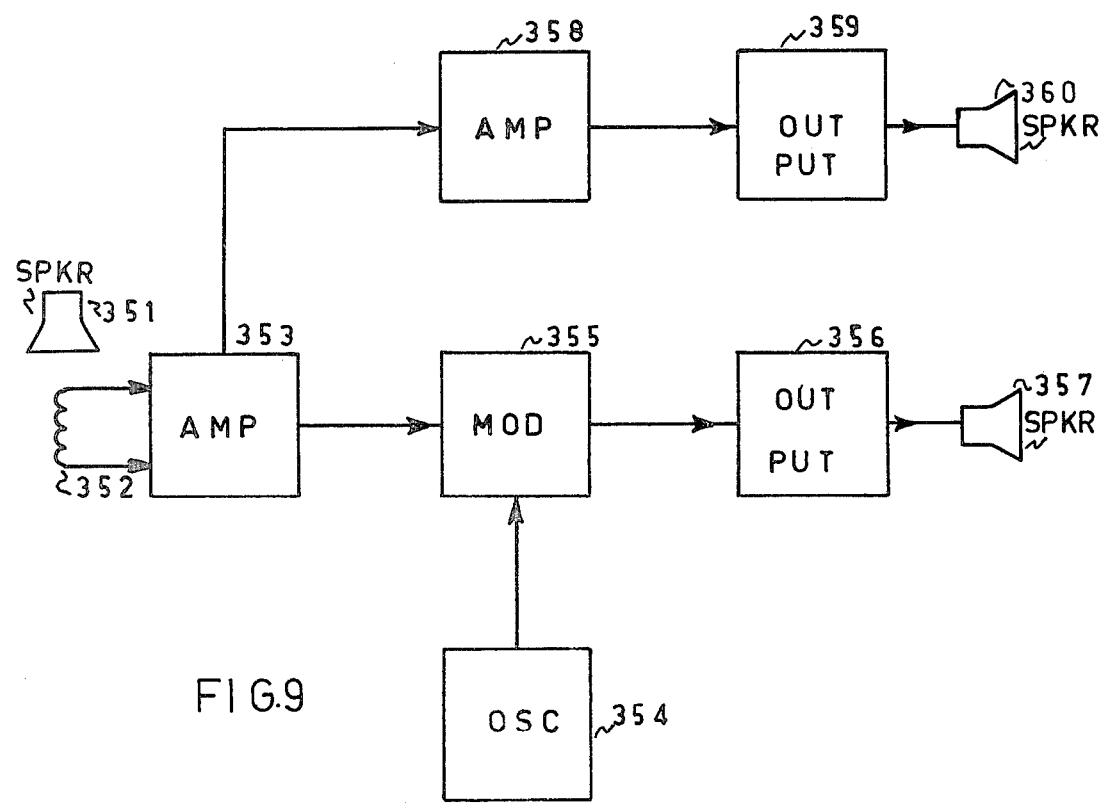
FIG. 9 is a block diagram drawing of internal circuitry of connector.

Slave drive component 365 in conjunction with antenna 366 functions as described in FIG. 9,11.

Branch stages 248-270 are used primarily for switching; 251-264 are used primarily for: (1) increasing or decreasing the receiver's (257) sound to speaker 264 (2) to pass its own channel sound to speaker 264 and at the same time disconnect receiver 257 from amplifier 263. Branch 253-258 is used primarily to increase or decrease sound. Construction may therefore by taylored to suit individual needs. Hence, a user basically interested in a finer balanced signal would purchase a set that may be constructed with three stages of 251-264.

When switch 304 (FIG. 3) is switched to right position this causes a signal to modulate modulator 300 with oscillator 303 with a frequency matching that of amplifier 308 (FIG. 4). Amplifiers 308, 309 consists of tuner circuit amplifiers followed by a demodulator. When switch 304 is set to position B this would modulate modulator 300 with a signal matching that of tuned circuit amplifier 309.

Signals via switch 304 are momentary, as the switch falls back to neutral or "off" position as soon as contact is made with position 11 left or right. Hence, when left position is elected demodulator 309 receives a signal as to feed relay 262 so that said relay connects to demodulator 259 to amplifier 263 by connecting wire 312 to 310 so that demodulator's (259) channel enters amplifier 263. The sound to demodulator 259 stems from auxiliary jack 306 through volume control 302.

To change back to a previous audio channel, switch 304 is momentarily connected to right position causing relay to change to its original position as a result of a signal from tuned circuit amplifier and demodulator 308 feeding a cancelling signal to relay 262, thereby reconnecting wire 310 to wire 311 and disconnecting wire 312 from wire 310. This means that tuned circuit demodulator 308 causes a short in the relay to deactivate the relay 262. Also, tuned circuit amplifier and demodulator 309 (FIG. 4) causes the activation of relay 262 through a transistor in demodulator's 309 output, said transistor connected to coil of relay 262 and to power supply. The presence of a DC signal from tuned circuit amplifier and demodulator 309's output causes said transistor to activate relay 262 which thereafter said relay maintains its own activation. A second transistor at the output of tuned circuit amplifier and demodulator 308 is connected in shunt over relay coil (of 262). At the presence of a DC signal from tuned circuit amplifier and demodulator 308, the output of said second transistor "shunts out" power through the coil of relay 262 to the extent wherein relay bar looses its grip, thereby deactivating itself. Note that the power to relay 262 is fed through a resistor which would maintain a low power level so that a "short out" of said second transistor easily deactivates relay 262. Said resistor also shields the "short out" so as not to affect any other voltages.

Auxiliary jack 306 (FIG. 3) serves to transmit an audio source, such as a tape recorder signal to modulator 300 through volume control 302, with the latter controlling volume, bass and treble.

Switch 301 when switched to B position, channeling thereby the signal of demodulator 314 to modulator 300 via DC amplifier 313. Being that DC output level of amplifier 313 depends on the strength of the signal from demodulator 314 the increase in the demodulator's signal will provide an increase of the negative signal from amplifier 313 to modulator 300 thereby reducing the signal of frequency doubler 296 to output amplifier 299. The reverse holds true. A decrease signal of demodulator 314 causes a decrease in the negative signal in amplifier 313 thus increasing frequency doublers 296 signal to output amplifier 299 through modulator 300. The increase or decrease of signal of demodulator 314 is dependent upon the reception of receive antenna 317 which feeds its signal to tuned circuit amplifier 316 followed by tuned circuit amplifier 315 to demodulator 314.

In operation, a componant having a combination of the circuitry of FIG. 3 is placed on or in close proximity to each speaker. When balance component 318 (FIG. 7) is in the "off" position, the speakers may be set via main control and also through volume control 319, for desired volume. The user may operate the system in this way by sitting or standing in the center of the room wherein speakers are located in the corners of the room. When balance componant (FIG. 7:318) is switched to "on" position, this componant will take control of the output of the speakers.

Hence, when considering stereo sound, i.e. the sound output from two speakers two components each comprising the circuitry of FIG. 3 are placed each on or near each speaker. The user holding the balance component (318 FIG. 7) turns same to "on" position from the center of the room. The equal signals from send antennas 317 which in turn is demodulated by demodulator 314, (FIG. 4) controlling DC amplifier 313, in turn controlling signal strength from frequency doubler 296 hence reducing the output of speaker 264.

After desired volume adjustments are set manually on balance componant from the center of the room, and when the user, possessing balance component, moves towards the right speaker (moving towards antenna 317 which is situated on or near each speaker) this will cause a decreased signal of the right speaker, while an increased signal is produced from the left speaker. The opposite holds true should movement be towards the left speaker.

The internal operation when movement occurs, is as follows: When atenna 317 (FIG. 3) loses some signal strength as a result of the movement of the balance component away from it, thereby causing an increased signal to output amplifier 299 due to the causing modulator 300 to increase its signal to 299 decreased negative power of DC amplifier 313. At the same time movement towards the antenna 317 of the opposite side of the room will cause a decreased signal to output amplifier 299, of its apparatus identical to FIG. 3 as a result of increased negative power of DC amplifier 313. Should the user move backward away from both speaker's & antenna 317 of apparatus FIG. 3 this will cause an increased volume from both speakers.

We have described to this point a simply constructed balance component (318, FIG. 7) as consisting of a single frequency transmitter 318 a loop antenna 317 and a volume control 318 controlling the power of the transmitter, hence causing an increase or decrease of the volume of the speakers manually or balanced automatically by movement towards or away from any speaker after it has been set manually to desired level.

For a finer balanced setting, it is desirable that the user first turn his balance component to off, manually set the volume of his receiver to his desired level, thereafter turn the balance component "on" and adjust the volume control 319, from his position at the center of the room.

For the problem of overriding interfering audio sounds disturbing the listener's audibility the automatic overriding volume-balance control component is used see FIG. 5.

To operate this component the user manually sets the desired 1 level in the manner previously described for the simply constructed balance component to a level over disturbing noises. The system would then automatically adjust channel volume up or down in relationship to any increase or decrease in disturbing noise, thus maintaining the desired overriding level.

Describing now the internal operations of the automatic overriding volume-balance control (see FIG. 5).

To achieve a balance volume, the following set up is made: Stages 320-324 create a special transmission system. This system operates thus: speaker 320 is a speaker from any audio device to be controlled, 320 transmits a regular audio signal. A signal is also tapped off from wire which leads the signal to speaker 320. The tapped signal is fed to modulator 321 which modulates the signal from oscillator 322 going to output amplifier 323 and transmits it over ultrasonic speaker 324. Any increase in volume of speaker 320 will not affect the automatic overriding balance control, since its counter signal is raised at the same time, so that if speaker 320 should increase by one volt, the counter signal of 324 would also increase by one volt, thereby cancelling the increased one volt from 320.

Being that the ultrasonic sound and audio will travel through the air at the same speed, since both are air waves, both waves will enter their respective microphones (audio and ultrasonic) at the same time.

The actual audio sound is fed to audio microphone 326 from speaker 320, while speaker 324 feeds an ultrasonic signal to ultrasonic microphone 325. Tuned circuit amplifier 327 is tuned only to the frequency signal of ultrasonic transmitter 321-324.

This signal is amplified again by tuned circuit amplifier 329. Demodulator 330 removes the ultrasonic carrier signal while feeding an actual sound signal to amplifier 331. The actual sound from speaker 320 is fed from audio microphone 326 to filter amplifier 328 which serves to trap and remove the ultrasonic frequency to ground, while amplifying actual sound. The signal is thenafter amplified by amplifiers 332-334.

Note that amplifiers 332-334 may also be filter amplifiers. This actual sound signal from amplifier 334 is fed to enter at 0 degrees into mixer 335 while at the same time the signal from amplifier 331 enters mixer 335 at 180 degrees out of phase, i.e. with a phase difference of ;b 180 degrees. These signals will cancel each other, leaving 0 voltage at the output of mixer 335 connected to detector 336. The same is the operation on the signal fed to mixer 337: Whereas the signal from amplifier 331 is fed at 0 degrees to mixer 337, while the signal from 334 is fed to mixer 337 at 180 degrees out of phase. This results in a 0 voltage output signal from mixer 337, the latter connected to negative detector 338. Both the outputs of detectors 336 and 338 are then fed to equalizer 339.

When a negative voltage is present in the equalizer 339, AGC 341 will react to this signal in increasing the amplification factor from amplifier 328 thereby increasing the output from microphone 326.

Similarly, the presence of a positive voltage in the equalizer 339 stemming from detector 336 will cause AGC 340 to increase its amplification factor from amplifier 327 so that the output of microphone 325 will be increased. This would result in 331 having a lower signal, lower than the signal from amplifier 334 to mixer 335 thereby resulting in a positive voltage at the output of detector 336.

Similarly is the case when microphone 326 receives a lower signal. Note, this would only correct small signal changes that may result due to moving or other factors resulting in different signal strength.

Such extra voltage is fed to equalizer 339 and to AGC controls 340, 341, to balance the output of microphone 325, 326 to equal strength.

Automatic gain control being sensitive only to positive voltage will result in an increased signal from amplifier 331. AGC 341 being negative sensitive, will react only to negative voltage thereby resulting in an increased signal from amplifier 334.

Thus signals from speakers 320 and 324 are continuously kept in balance. When operating the system, the user would adjust volume control 344 when he sees that the indicators of voltage meters 342, 343 are not in the same position. This action serves to adjust thereby the volume of microphone 326 more or less so that meter indicators are in the same position. The above serves so that at all times without interfering noise, the signals of meters 342, 343 should have the same levels.

Microphone 326 is sensitive audio to sound that emenates from sources other than from speakers 320, 324. When such additional sound enters microphone 326, it causes an increased signal to pass through its connected stages to mixer 335 so that signal from amplifier 331 will not be able to cancel same, as microphone 325 receives only ultrasonic sound. The additional actual sound causes a positive detection in 339. However, being that the AGC system is made to have a limited sensitivity, only a small fraction of the positive voltage is cancelled, the surplus of positive voltage fed to the output of equalizer 339 followed by volume control 345 would be used to control the overall increase or decrease of the speakers. The positive voltage is fed to modulator 362 thereby reducing the power of oscillator 347 that is fed to transmitter 348 leaving a weaker signal at loop antenna to air and thereafter to antenna 317 (FIG. 3).

As stated previously, when a reduced signal is received at antenna 317, the output signal of modulator 300 is increased, hence, increasing the output signal of speaker 264 (FIG. 4). (Thus the output of speaker 264 is increased or decreased upon an increase or decrease of noise not coming from speakers 320, which in actuality 320 represents speaker 264 in itself.

Note that switch 346 may be set manually to volume control 350. This serves as a bypass of the automatic overriding volume-balance control system. With regard to automatic volume control 345, this may also be set in advance manually so as to govern the amount of automatic increase in sound output of the speakers in relation to extraneous interference noises.

Figure 6:
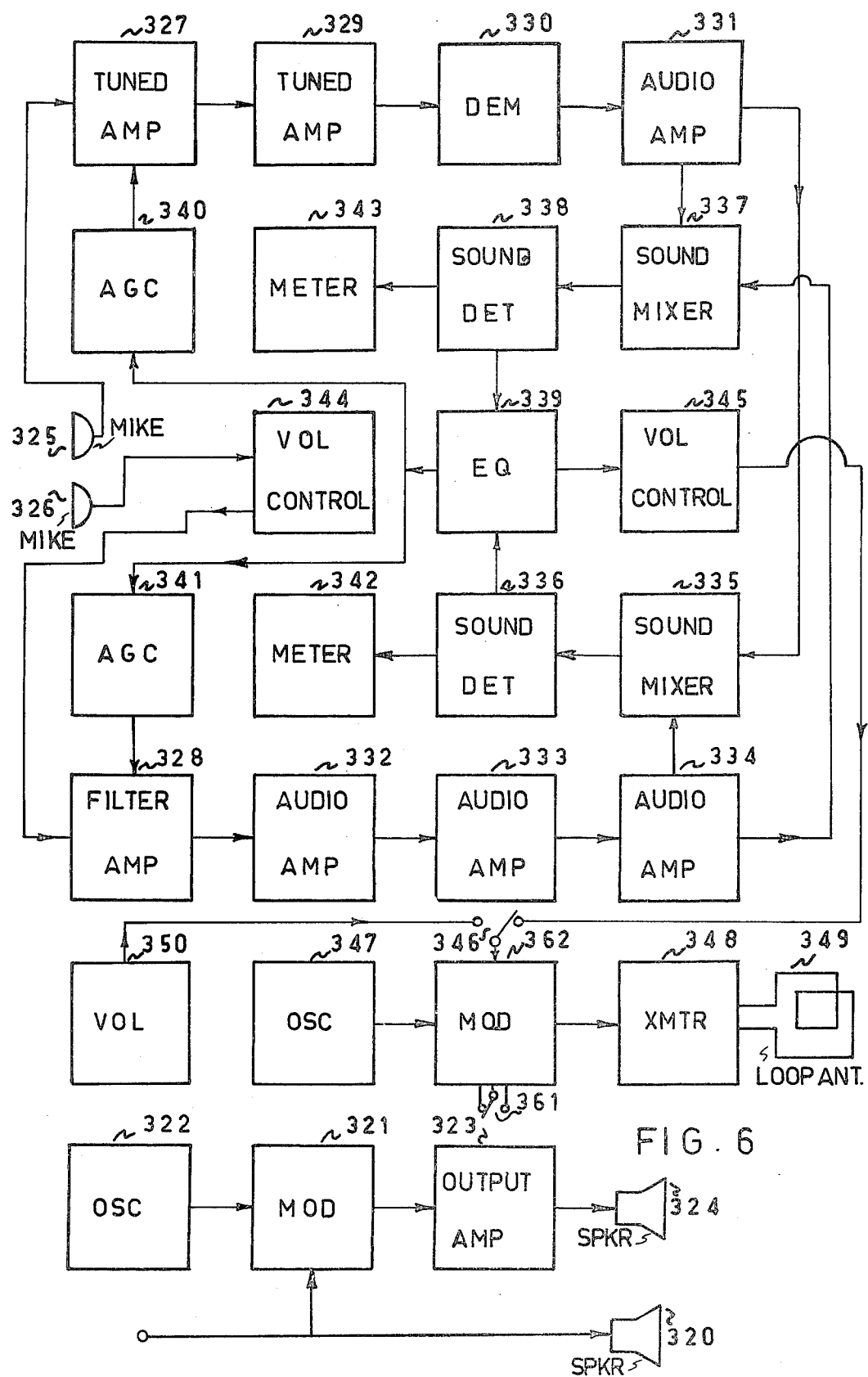
FIG. 6 is a block diagram drawing of the circuitry of wireless phaser transmitter.

For wireless operation of the phasing transmitter see FIG. 6. The provided circuitry enables the function of automatic overriding volume-balance control. Note, all increases or decreases in the level of speaker 357 are fed simultaneously through speaker 360, & speaker 357 at the same rate of time, phase, frequency, amplitude, thereby not causing any interferance in controlling. The only control signal is one not having the same phase, time, frequency, amplitude, as that of speaker 360, 357, the surplus signal controlling controls without having to connect the modulator of the ultrasonic transmitter to the speaker wires. Coil 352 (similar to a telephone pick up coil) is connected to amplifier 353 feeding amplifier 358 and output amplifier 359 and speaker 360 producing actual sound. A secondary signal is fed from amplifier 353 to modulator 355 to modulate ultrasonic oscillator 354, feeding this output to output amplifier 356 to speaker 357.

It should be noted that various adaptations of the same teory may be made e.g. with regard to FIG. 9 if speaker 357 is changed to a radio transmitter and speaker 360 to a light transmitter, transmitter 357 would transmit a special phased with a given amplitude signal. This said signal would be received by a radio antenna in place of 325, (FIG. 5) which said signal would flow from 357 to 325 at the speed of light. After passing tuned amplifiers 327, 329, 330, and 331, this said (357) signal would pass through mixer 337 and to detector 338, creating a voltage. The light transmitter, in harmony with said sequel, transmits a light signal at the speed of light to LCS 326 (FIG. 5) which would carry the same special phased and given amplitude signal, the LCS would pass the light signal through amplifier 328, 332, 333, 334, and feed a 180 degree out of phase signal to mixer 337 this would fully cancel the entire signal from amplifier 331 causing a zero volt at detector output 338 since the 180 degree signal is exactly equal to the 331's signal in amplitude in phase when a person enters the room disturbing the beam of light of its transmitter although this would cause a disturbance to the delicate structured signal, so that either its amplitude would be fully broken thereby causing a voltage buildup in detector 338, this voltage would then transfer a relay to function as a switch connected to detectors output. Note, any other light would not effect the operation of the apparatus since any other light would not be able to cancel out the specially phased and given amplitude signal since the only way to cancel this signal is by a canceling wave form of equal phase shape from and of equal amplitude. Note also that circuitry and expense may be saved by connecting the output of amplifier 331 and amplifier 334 directly to detectors 336 and 338 thereafter connecting them to equalizer 339 used to invert the balance signal output so that balance could be used to increase the speaker's sound over the interfering noise or when switching switch at opposite direction will cause balance to reduce speaker level so that listener may hear better a desired sound other than that of speaker. Note, also, the cancelling signal in balance is always of same quality as original signal such as, for instance, when sound is used ultrasonic sound would be its counter balance signal. When light is used radio waves would be used which travels at the same speed as light, so that their travelling time is equally balanced. If a time delay is desired between balanced signals a counter signal of a different carrier would be used, such as one one signal being radio wave and the other signal being of ultrasonic sound since creating a difference in time between cancellation of the two signals would result in a fixed time delay.

Note that phasing is equally kept between the two signals through the amplifier stages so that when speaker 320 has a positive phase output so will speaker 324 have a positive phase. This will cause an equal phasing through out amplifier stages for proper mixing. Similar phasing, amplitude, frequency, time, may also be done in stages 328, 332-335, 327, 329-331, 337 by using stages as a time delay or to adjust any time, phasing, amplitude frequency difference that might occur. FIG. 6 shows how phasing is kept equal through its stages be passing through similar stages both signal so that if a positive signal enters 355 the same positive signal will equally have the same phase output 356 and 359 and at speakers 360 and 357. Note that instead of two speakers 360 and also amplifier 353 can have an AGC to keep distortion from preceding stage. Not this system would achieve best results when speaker 360 serves as the main output signal. and 357, one speaker could be used. Also, microphones 325 and 326 (FIG. 5) may be replaced by one single microphone, by connecting a single microphone wired to input of amplifier 325 and input amplifier 326. If sets of two speakers are used such as speaker and microphone, these sets are kept in close proximity or in one shell. Stages of adio sound amplifier are kept equal in number to stage of ultrasonic amplifier not only for phasing but also to keep the time factor equal through both stages. To overcome the problem of phasing, the system could be made so that the output of amplifiers 331 and 334 are changed to DC levels which their resulting DC will be fed to the equalizer thereby having no problem of phasing since the sum of the signal is changed to a DC level having no bearing with phasing signal. Summarizing the Automatic gain control (FIG. 5) 340 and 341 operate in a manner whereas if there is an increase in actual sound volume to microphone 325 as compared to microphone 326, the signal to microphone 325 will cause automatic gain control 341 to increase automicly the signal from microphone 326 to equal that of its counterpart (325). Hence, there will be a cancellation resulting in a 0 voltage output signal. Note that the said increase or decrease of signal may be a result of a movement or of a slight change in position towards one, and away from the other microphone.

Similarly, when microphone 326 receives a stronger signal than microphone 325, automatic gain control 340 will increase power to equal that of its counterpart, therefore maintaining a 0 voltage output signal.

Note that AGC 340 is positive sensitive hence, increasing tuned circuit amplifier factor 327 when a positive signal results in the equalizer.

Similarly, AGC 341 has a negative sensitivity thus increasing the gain factor of amplifier 328 as a result of a negative signal in the equalizer.

Note the negative detector 338 changes the signal received from mixer 337 via amplifier 331 with 180 degree signal out of phase from amplifier 334, into negative voltage. With a balance output from amplifiers 334, & 331, mixer 337 will beat both signals against each other thereby producing a full cancellation. Similarly is the operation on the signal fed to positive detector 336 when the 180 degree out of phase signal from amplifier 331 cancels the zero degree signal fed to mixer 335 by amplifier 334.

It should be noted that with the addition of the circuitry and couplers in FIG. 1, we have demonstrated how the system can wirelessly control all speaker functions from remote areas so that the users can be wireless remote couplers control all speaker functions.

Note also that throughout the entire system, couplers to coupler and/or couplers to receivers can receive signals through any type of energy transmission, such as light or ultrasonic, infra-red and other energy sources. An example of each type of energy exchange is whereby the radio wave is changed into ultrasonic sound wave by using ultrasonic sound as the carrier means. For other energy carriers, ultrasonic transmitter. Would be replaced by the desired energy carrier such as a light transmitter. In this example, light transmitter would transmit its signals on a light carrier and receiver would be a light sensitive cell, thereby receiving the transmitted light wave from transmitter. Similarly pairs of energy transmitters and receivers would replace transmitter and receiver for their operation.

Describing now the operations of the balancing voltage control. See FIG. 9.

Coil 401 of demodulator feeds power to capacitor 402 through diode 403, changing the signal to DC voltage level. This DC voltage level is filtered through resistor 404, & passed to capacitor 405, which refines the DC voltage. The DC voltage is then fed from capacitor 405 through resistor 406 to the base of transistor 407. Transistor 407 is loaded with resistor 408 connected to transistor's collector and to the power supply. Base of resistor 409 feeds bias voltage to base of transistor 407. The biasing voltage is so chosen that it would cause a zero voltage from collector to ground in relationship to load resistor 408, from collector to power supply. With 10 volts of power, for example, the transistor would show a zero meter reading from collector to ground and a 10 volt meter reading from collector to power supply. When an audio signal enters through resistor 410 and through capacitor 411, feeding the audio signal to collector of transistor 407, the said audio signal will be shorted to ground due to transistor 407 acting as a short by its over biasing power from resistor 409. Resistor 10 is selected so as to reduce the strength of said audio sound to an inaudible level as it passes from collector's output 12 to its audio amplifier. To increase the audio level entering the amplifier through collector's 412 output, the bias overriding voltage must be reduced, thereby increasing voltage from ground to collector of transistor reducing the acted short of transistor 407, thereby increasing the audio level passing to amplifier from collector's output 412. The reduction of bias is created by feeding an opposite voltage to bias the base of transistor 407 so that if, for example, the base is fed with a positive voltage a negative voltage will be fed to base of transistor 407 cancelling the positive voltage on base causing a reduction in the acted short. The negative voltage, in FIG. 11, stems from demodulator's coil 401. The negative voltage is created by diode 403 charging capacitor 402 and capacitor 405 with a negative voltage. The negative voltage will be fed to base of transistor 407, through resistor 406, causing a cancellation of positive voltage from resistor 409, thereby reducing the acted short which in turn will increase the audio level at the output of 412 stemming from resistor 410. Resistor 406 is used to shield capacitor's 405 voltage from loading which may occur from transistor 407, and to adjust the voltage fed to base transistor 407. The increase and decrease of the said audio level is therefore accomplished by the coil of demodulator 401 and its components, wherein their voltage is dependent on the transmitted signal which is received by demodulator so that with a stronger signal a higher audio level will be achieved by the reduction of the acted short. A weaker signal, on the other hand, will cause a weaker audio level, due to the increase in the acted short of transistor 407. If an addition of strength is desired, the additional strength would be increased whereby transistor 407, could be used to drive another transistor acting as a volume control. This would increase the power of demodulator since transistor 407 would be used as a DC amplifer. Also, a reverse condition may be accomplished whereby modulator signal causing an acted short, resistor 409 reducing short.

Describing now the circuitry of connectors 206 and 268 shown in diagram of FIG. 4. See FIG. 9.

The connectors operate as follows:

Any signal, such as audio-video of a frequency signal, is fed to capacitor's input 501. Output 502 of connector is connected to a signal amplifier. Resistor 503 is the resistor which limits the signal level to the proper amplitude level so that no distortion shall occur at the output of the connector. Resistors 504 and 505 form the level for the proper operation of transistor 506, which is connected from emitter to ground through coil 507 and from collector to power through resonant coil 508 and capacitor 509. Coil 510, diode 511 and capacitor 512, are the demodulator which demodulates the resonant signal from its primary coil 508. Resistor 513 gives the demodulator the right bias level. Output 502 feeds the output of demodulator's coil 510 and its components to the connected amplifier. Thr signal at input 501 will not pass to the output 502 because the signal at input 501 will be rejected by coil 508. Coil 508 will not resonate to other signals from input 501, thereby rejecting signals from input 501. Also, signal from input 501 will be too weak to pass through coil 508 without a carrier. In order for a signal to pass to output 502, from input 501, a carrier signal is needed. If an audio signal is to be passed on to an amplifier from input 501 to output 502, for example, the process would entail the audio signal being fed to input 501 and output 502 being connected to an amplifier. For audibility of the audio sound the controller would tune oscillator 516 by tuner 517 causing oscillator signal to match the frequency of resonant coil 514 in conjunction with capacitor 515. Coil 514 matches frequency of coil 508 thereby causing coil 507 to feed the oscillator signal to the emitter of transistor. The oscillator signal will be amplified by transistor's emitter as an emitter follower passing oscillator's signal from base to ground by capacitor 518. The amplified signal will pass to resonant coil 508 and to secondary coil 510 where it will be demodulated by diode 511 and capacitor 512. The audio signal at input 501 will now modulate the oscillator's signal with amplitude modulation, acting as an amplitude modulator for the oscillator's signal. The modulated signal will now pass to the demodulator which will remove the radio frequency signal and feed the audio signal to output 502 and to amplifier through resistor 521 and capacitor 519, which filters the demodulator's output.

The audio level of the audio amplifier can also be increased or decreased by oscillator 516 in conjunction with volume control 520. When volume control 520 is set to reduce the strength of oscillator's signal the audio level will be reduced at output of demodulator 502. On the other hand, the increase of oscillator's signal by volume 520 would result in an increase of sound to audio amplifier from output 502. This same function could be operated by FM modulation, by feeding input 501 directly to oscillator to cause FM modulation and feeding into oscillator through amplifier and demodulator. When the signal of oscillator 516 is tuned to a different frequency, audio sound will no longer be present at output 502, since the RF carrier is no longer present, thereby cutting off the carrier means for input 501 to output stage 502.

For best performance, resistor 503 would be set so that at full oscillator signal no distortion would exist at output 502 from overdemodulation and the right amount of sound would be present in order that when oscillator signal is removed no leakage would be present through coils 508 and 510.

Note, secondary winding 510 could be connected to a series of tuned amplifiers for even a higher selectivity which is thenafter followed by a demodulator. This would reduce even high levels of sound to pass through from input 501 to output 502.

Note, also, the system could operate by air, whereby coil 514 would pick up a signal from an antenna connected to input of coil 514 and receive a signal through a transmitter with a chargeable frequency. This would enable a person to have a selection of a variety of audio sounds, & to enable the person to select one frequency or one signal from many others, wirelessly. Also it would enable the person to control its volume control.

Describing now the operations of the synchronizer, shown as 222, 223 in FIG. 2. See FIG. 10 a drawing of a detailed view synchronizer circuitry.

Synchronizer 222 in conjunction with oscillator 223 forms the phased signal. The IF signal is fed in from limiter primary coil 601 which feeds a limited signal to secondary coil 602 and capacitor 603, which is tuned to the resting frequency of IF signal. The said signal is then amplified by transistor 604. Resistor 605, connected from ground to emitter of transistor 604 is chosen to keep transistor from oscillating; also a tiny capacitor (not shown) may be added from collector to base. Collector of transistor 604 is connected to resonant circuit coil 606 and capacitor 607, which is connected to power. Transistor 604 will amplify the signal from limiter in 601 and feed it to secondary coil 609, which is connected to oscillator, thereby feeding the synchronizing signal to coil 609. Resistor 608 supplies the bias for transistor 604.

The oscillator consists of transistor 610 biased by resistor 611. The output of collector is connected to coil 613 connected to power. Coil 613 is tuned by capacitor 612 to a resonant circuit. Secondary coil 614 produces a feed back for oscillation through capacitor 615, which is connected to emitter of transistor 610, from coil 614. Resistor 616 feeds ground voltage to emitter of transistor 610. Capacitor 617 feeds the base signal to ground. Oscillator frequency will be that of coil 613 tuned by capacitor 612. When a signal of the resting frequency is received at coil 602, this said signal will be passed on to coil 606. The signal in the secondary coil 609 stemming from coil 606 will override the oscillator's own signal by having higher amplification from transistor 610 causing oscillation to the signal from coil 609. Even coil signal is reduced or removed oscillation to the phase of signal 609 would be. 609's signal is present always when the IF signal is steady somewhat. Note, coil 606 matches infrequency to the frequency of coil 613. The above said function would therefore cause the said oscillator to operate at the phase of IF signal. When the resting frequency is changed to a different frequency, the different frequency will be rejected by coils 602 and 606, thereby resulting in no output to coil 609, leaving oscillator to oscillate at its own phase. Note, since the oscillator signal is increased during the synchronization pulse and decreased during the absence of the synchronization pulse, the automatic gain control amplifier connected to the output of 618 will adjust to the oscillator's difference in signal to form an over all even amplitude level signal. The synchronizing stage may consist of two or more similar stages shown in the synchronizing stages. This would highly reject any other frequency above or below resting frequency to cause a highly purified oscillator phased signal.

In summary, the limiter is used for the extraction of amplitude modulation changes. The synchronized oscillator is used for the FM extraction. The limiter and the synchronizing oscillator are used for best results in both.

Figure 11:
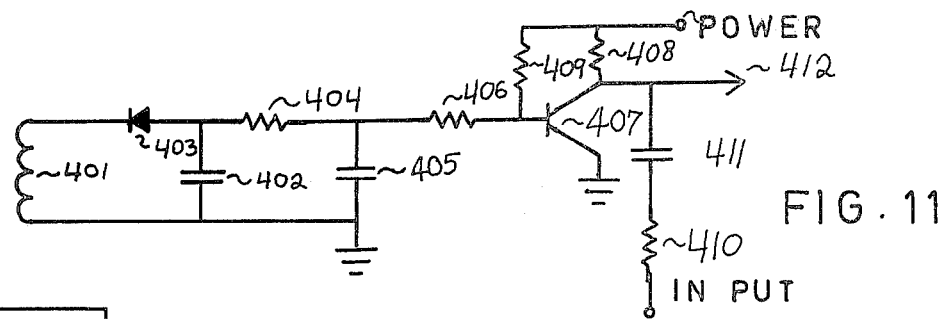
FIG. 11 is a block diagram drawing of the internal circuitry of sound mixers and detectors.

Describing now the mixing output method of the automatic overriding volume balance control as shown in FIG. 11, a block diagram drawing of the internal circuitry of an automatic overiding volume balance control, A.O.V.B.C.

701 is the demodulator of ultrasonic sound which changes ultrasonic signal back into an audio signal. 702 amplifies the audio sound of demodulator 701. 703 and 704 amplifies the actual sound. In operation, amplifiers 702 and 704 are equally phased, so that when 702 has a positive phase signal, 704 has a positive phase signal and when 702 has a negative phase signal 704 has a negative phase signal.

Describing now the detectors' sound detector operations. Coil 705 feeds the audio signal to ground and to diode 706 which changes audio signal to a DC voltage. Capacitor 708 charges the said DC voltage. Resistor 707 is used to load capacitor 708, so that capacitor 708 would have a quicker response to changes in voltage. The same exact operation goes through coil 711 with diode 712, capacitor 714 and resistor 713.

The difference between the two sound detectors, is that coil 705 in conjunction with diode 706 produces a negative voltage, thereby acting as a negative detector, and coil 711 and diode 712 produces a positive detection, thereby acting as a positive sound detector. With a positive phased signal at amplifier 702's and amplifier 704's output, amplifier 704 will induct a signal in coil 715. The signal will pass to coil 711, producing a positive voltage. At the same time, a positive phased signal will enter coil 716 from amplifier 702, through diode 717. The positive signal from amplifier 702 will cancel out the positive signal of amplifier 704, thereby producing zero voltage at capacitor 714 through coil 711. If a signal from amplifier 702 is not as strong as a signal from amplifier 704, then a positive voltage will be produced at capacitor 714.

The same exact operation will occur in the negative audio detector coil 705 and diode 706. With a negative signal stemming from amplifier 702 and amplifier 704, a signal from amplifier 702 will induct a voltage in coil 710 which at the same time a negative voltage from amplifier 704 will enter coil 711 through diode 718, cancelling the negative voltage from amplifier 702 and producing a zero voltage at capacitor 708.

Note the negative detector 705 and diode 706 will not detect a positive voltage because diode 706 will not permit any circuit flow. Further, coil 711 connected to amplifier 704 cannot conduct its positive voltage which become a negative voltage in coil 711 as a phase inversion because diode 718 and diode 719 will not permit a positive voltage to pass to coil 711. Therefore, coil 705 will not receive current flow when a positive phase signal enters from amplifier 702 and amplifier 704.

The same applies to positive detector which will reject any negative signal by the diodes 712, 717, and 720. They will resist any negative voltage from entering into modulator coil 711.

When a positive signal from amplifier 704 enters coil 715, the positive signal is always cancelled by a positive signal from amplifier 702 entering 716. 716 is set so that the positive signal from amplifier 702 is changed to an opposing signal 180 degrees out of phase in respect to positive signal of 715. This 180 degree out of phase signal will cause coil 716 to induct a negative voltage into coil 711, thereby cancelling the positive inducted voltage of coil 715. If the inducted voltage of coil 715 exceeds the inducted voltage of coil 716 a positive voltage would stem from diode 712, charging capacitor 714. If the inducted voltage of coil 715 is equal to the inducted voltage of coil 716, a full cancellation would occur at coil 711, thereby producing zero voltage level. If the voltage of 716 exceeds voltage of 715, this would cancel out the voltage of 715 and its remaining voltage would have no effect since diode 712 will not permit a negative voltage to pass through to detector coil 711. Therefore two conditions can be present at detector 711 and its parts; Either the signals are cancelled to a zero voltage, or a positive signal could be present from amplifier 704 whereby amplifier 704 would have a higher inducted voltage.

Note, any signal stemming from amplifier 702 can not produce any type of voltage to detector 711, since the only voltage passing to detector 711, from amplifier 702, will be negative induction voltage which will be resisted by diode 712. Therefore, even without any voltage from amplifier 704 and a voltage from amplifier 702 there would result no voltage output from coil 711. All the voltages fed by amplifier 702, although it is positive voltage changed by a 180 degree out of phase signal to a negative signal, will not be able to pass to detector coil 711. The function of signal in coil 716 stemming from amplifier 702, is to be used as a cancelling signal to cancel amplifier 704's signal. This same exact function applies to detector coil 705, which will be sensitive only to negative voltage and which will reject any positive voltage that may stem from amplifier 702 or amplifier 704. Also, it will cancel voltage from amplifier 704 passing to coil 711.

The positive voltage from capacitor 714 on the negative voltage of 708 passes into equalizer which consists of resistors 721 and 722, purifying its output to capacitor 724 and loading resistor 723. The output of capacitor 724 is fed to diodes 725 and 726, which will detect and feed to output 727 only negative voltage stemming from detector coil 705 through diode 706. The same will occur at diodes 728 and 729, which will feed to their output 730 any positive voltage stemming from detector coil 711 in conjunction with diode 712. Capacitor 731 refines any positive voltage ripple that occurs at output 730, while capacitor 732 will refine any ripple of negative voltage that may occur at the output of 727.

Figure 12:
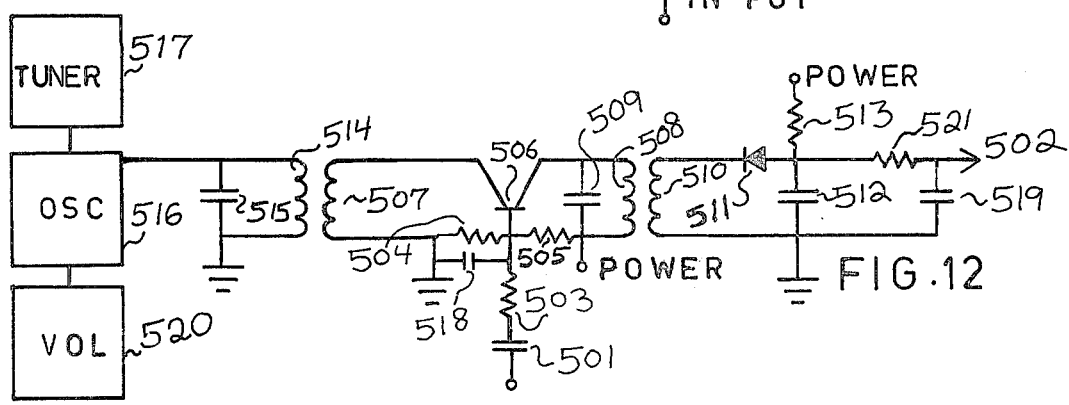
FIG. 12 is a block diagram drawing of the internal circuitry of a speaker transformer.
Figure 13:
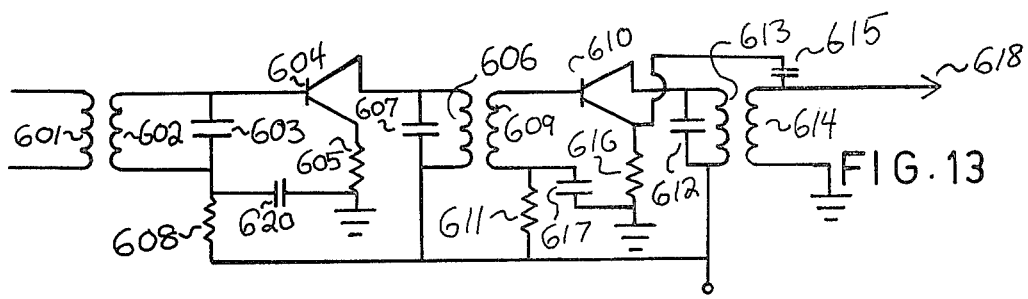
Figure 14:
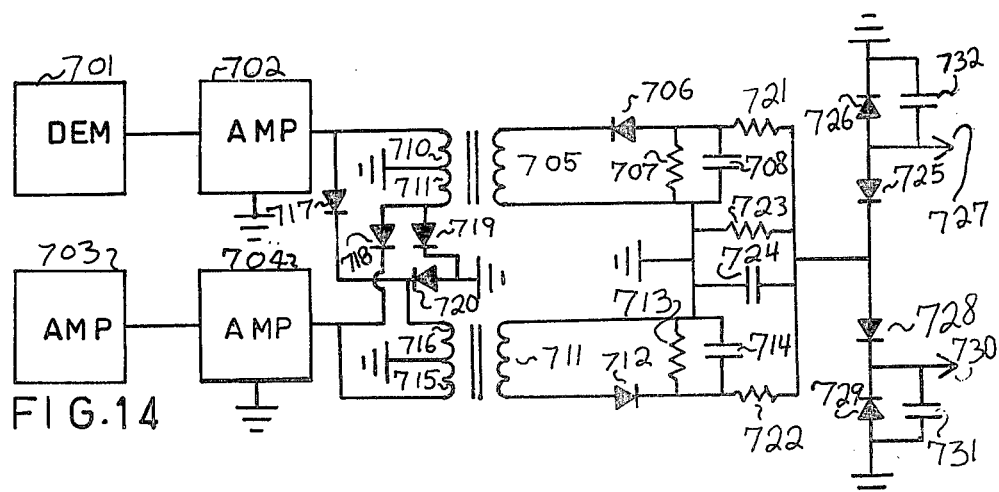
Figure 15:
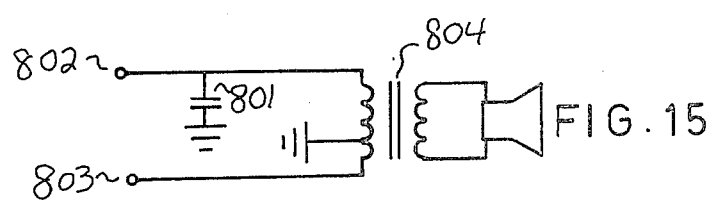

FIG. 12 is a diagram drawing of transformer, shown as 256 in FIG. 4. Capacitor 801 which is tuned to the tuned circuit amplifier and which has a stronger signal from the tuned circuit input 802 than the audio sound at input 803, thereby easily overrides the audio sound at the input of transformer 803. The coil of this transformer can be made of ferrite. Capacitor 801 tunes the transformer to the frequency of tuned amplifier 254, 255.

It is understood that the form, implementation and adaptation of the invention herewith described is to be taken as an illustrative embodiment only of the same, and that various procedural changes may be resorted to without departing from the spirit of the invention.

We may therefore say that the system described herein is a system whereby one receiver receiving energy stemming from two sources, such as its own transmitted energy and an interfering energy, whereby its own energy will be cancelled out by the receiver in conjunction with the transmitter, while the interfering energy will have no cancellation in the receiver, thus having an existing energy used for controlling.

The components described in FIGS. 5, 6 control energy in two ways (1) whereby the existing energy from the outer interfering energy is used as the controller (2) or whereby the absence of its own cancellation signal would create an imbalance in the receiver, said signal used for controlling.

An example of using the absence of its own energy may be applied in numerous ways. One example: A user desires to turn his receiver "on" upon his entering the room and "off" upon leaving.

A distinct difference between the components described herein and that of an electric eye lies in the fact that an electric eye is sensitive to light that is similar to its transmitted source, thus allowing it to be interchangable with another unit of its own type (any light will trigger an electric eye). However, the components described in FIGS. 5, 6 will operate only as a result of its own transmitter, not being interchangable with another transmitter, even of its own kind that is out of phase and amplitude. Moreover, the beam of an electric eye must be broken, whereas the components described herein would register any movement or change in position.

In reference to FIG. 1, the first coupler is the slave drive (205—see also FIG. 4), the second coupler is the sub slave drive (206—see also FIG. 4); the third coupler is the sub sub drive (204—see also FIG. 3); the fourth coupler is the Balance component (207—see also FIGS. 5, 7).

We claim:

1. A remote control system for continuously controlling one or more functions of one or more receivers comprising:
   (a) a transmitter including means for generating a carrier wave,
   (b) means for modulating said carrier wave with plural subcarriers each subcarrier conveying information relative to a specific function to be controlled or varied at said one or more receivers,
   (c) means at said transmitter for sensing the condition or state of the said receiver function or functions,
   (d) the said sensing means varying the subcarriers in a manner such that the receiver functions will have an apparent constant magnitude in the vicinity of the remote control transmitter.

2. The remote control system of claim 1 wherein the subcarriers are modulated either as to frequency or amplitude.

3. The remote control system of claim 1 wherein the controlled receiver function is sound level.

4. The remote control system of claim 3 wherein the said sound level can be set so as to be automatically lowered in an inverse proportional relationship to the sound level emanating from sources other than said controlled receiver.

5. The remote control system of claim 3 wherein the said sound level can be set so as to be automatically raised in a direct proportional relationship to the sound level emanating from sources other than said controlled receiver.

6. The remote control system of claim 3 wherein the said sound level can be set so as to be automatically lowered or raised to a predetermined desired level below or above the sound level emanating from sources other than said controlled receiver.

7. In a remote control system of claim 1, a connector for selecting and/or connecting a first signal from among a plurality of signals to connect one stage to another, comprising a tuner for tuning an oscillator signal, which said oscillator signal feeds a tuned second signal to a modulator wherein said modulator feeds said second signal to a tuned amplifier and/or to a demodulator, whereby said selected first signal is passed on through said modulator and thereafter to said demodulator.

8. In a remote control system of claim 1, an automatic overriding volume control for selecting a signal among a plurality of signals, for controlling, comprising,
   (a) a speaker transmitting the controlled audio signal as actual audible sound,
   (b) an ultrasonic transmitter, transmitting the said controlled audio signal, whereby the said controlled audio signal modulates the said ultrasonic transmitter by frequency modulation or amplitude modulation,
   (c) means located at a remotely located coupler for receiving wirelessly the said audible sound and other interfering audible noises,
   (d) means for receiving the said ultrasonic modulated signal,
   (e) amplifying and phasing means located at said remotely located coupler for phasing and amplifying the said received controlled audible sound signal with the said receiver modulated ultrasonic sound signal,
   (f) mixing means for mixing the said phased controlled audible sound signal and the said phased modulated ultrasonic signal whereby the said phased controlled audible sound signal and the phased modulated ultrasonic signal will cancel, leaving an output signal resulting from the said interfering signal and using said resulting signal as a signal source for controlling.

9. In a remote control system of claim 1, synchronizing means for synchronizing the said carrier waves so as to eliminate cross over, whereby when two or more carrier waves are present at the same frequency, but not in phase or having identical characteristics, thereby causing distortion and/or cancellation and/or cross over interference.

10. A remote control system of claim 1, whereby said sensing means comprising,
   1. a first transmitter, including means for generating a carrier wave,
   2. means for modulating first said carrier wave with a plurality of subcarriers, each of said subcarriers conveying information relative to a specific function to be controlled or varied at one or more receivers,
   3. a first synchronizer for synchronizing the said first transmitter to the signal of the master control unit, 4. a second transmitter for transmitting a second carrier wave,
5. means for modulating and varying the signal to said second transmitter,
6. means for generating a first subcarrier signal for modulating the said second transmitter,
7. a third transmitter for transmitting a third carrier wave having the same frequency as said first carrier wave,
8. means for modulating and varying the said third transmitter and means for generating a second subcarrier for modulating the said third transmitter,
9. a first receiver located in the said first transmitter, said first receiver receiving the said second and third transmitter's signal,
10. a first subcarrier amplifier located in said first receiver for amplifying the said first subcarrier signal and feeding same to the modulator of the said first transmitter,
11. a second subcarrier amplifier located in said first receiver for amplifying said second subcarrier signal and feeding same to the modulator of said first transmitter,
12. a variable auxiliary jack means located in the said second and third transmitter for imposing a variable auxiliary intelligence signal onto said second and third transmitter,
13. means for generating a signal for switching said signal of said second and/or third variable auxiliary jack means so as to select for connecting said auxiliary jack means or another audio device,
14. a second and third receiver located at the said second and third transmitter for receiving a signal from said fourth transmitter and changing said received signal to a DC signal,
15. a second and third synchronizer located at said second and third transmitter for synchronizing and phasing said second and third transmitter's signal,
16. means for modulating and varying the signal of a fourth transmitter,
17. mixing means for creating a signal source for driving the said modulator of said fourth transmitter, and/or other controls, said mixing means mixing the audio and interfering and ultrasonic demodulated signals whereby said demodulated ultrasonic signal stems from a tuned amplifying means and emanating from a first microphone and said audio and interfering signal stemming from a first audio amplifying means that is filtered and emanating from a second microphone,
18. a first automatic gain control means for correcting and stabilizing the said ultrasonic and audio signals,
19. a fifth transmitter connected to a first speaker which said speaker transmits the signal from said transmitter,
20. a modulator modulating said fifth transmitter,
21. a second audio amplifying means acting as a sixth transmitter connected to a second speaker, which said second speaker transmits the signal of said second audio amplifying means,
22. a third audio amplifying means for maintaining a signal that is equal to the amplitude, phase, and in time with the signal of the ultrasonic transmitter or having the said third audio amplifying means connected into said first audio amplifying means thereby maintaining a signal that is equal to the amplitude, time and phase of said ultrasonic transmitter,
23. a fourth amplifying means having a second automatic gain control means for amplifying a signal from a pick up coil means and controlling its own said fourth amplifying means so as to eliminate distortion that may occur at said third amplifying means and/or having controls to set the reaction level of the said signal source to react to some of the signals of the controlled speaker, whereby increasing or decreasing the said controlled speaker's output, by some parts of the said controlled speaker's signal, and to the modulator connected to said fifth transmitter, said pick up coil means feeding an electromagnetic signal from speaker to be controlled to said fourth amplifying means and/or the means for controlling the controlled speaker by using said controlled speaker's output acting in place of the said sixth transmitter whereby the said modulator modulating the fifth transmitter is connected to the said controlled speaker.

* * * * *